United States Patent
Lee

(10) Patent No.: US 7,172,959 B2
(45) Date of Patent: Feb. 6, 2007

(54) METHOD FOR FORMING DUAL DAMASCENE INTERCONNECTION IN SEMICONDUCTOR DEVICE

(75) Inventor: Kang-Hyun Lee, Yongin (KR)

(73) Assignee: Dongbu Electronics, Seoul (KR)

( * ) Notice: Subject to any disclaimer, the term of this patent is extended or adjusted under 35 U.S.C. 154(b) by 23 days.

(21) Appl. No.: 11/024,842

(22) Filed: Dec. 30, 2004

(65) Prior Publication Data

US 2005/0142832 A1 Jun. 30, 2005

(30) Foreign Application Priority Data

Dec. 31, 2003 (KR) .................. 10-2003-0101807

(51) Int. Cl.
*H01L 21/4763* (2006.01)
(52) U.S. Cl. .................. 438/622; 438/624; 438/637
(58) Field of Classification Search ............ 438/622, 438/624, 637, 638, 639, 671, 672, 687
See application file for complete search history.

(56) References Cited

U.S. PATENT DOCUMENTS

| | | | |
|---|---|---|---|
| 6,492,276 B1 * | 12/2002 | Huang | 438/700 |
| 6,649,515 B2 * | 11/2003 | Moon et al. | 438/637 |
| 6,858,528 B2 * | 2/2005 | Meagley et al. | 438/629 |
| 2001/0021581 A1 * | 9/2001 | Moon et al. | 438/637 |
| 2002/0140104 A1 * | 10/2002 | Morrow et al. | 257/774 |
| 2003/0224595 A1 * | 12/2003 | Smith et al. | 438/637 |
| 2004/0183202 A1 * | 9/2004 | Usami | 257/762 |
| 2005/0037605 A1 * | 2/2005 | Kim et al. | 438/622 |
| 2005/0106886 A1 * | 5/2005 | Goodner et al. | 438/706 |
| 2005/0124152 A1 * | 6/2005 | Meagley et al. | 438/631 |
| 2005/0186782 A1 * | 8/2005 | Burke et al. | 438/638 |

FOREIGN PATENT DOCUMENTS

| | | |
|---|---|---|
| KR | 2001-0079765 | 8/2001 |
| KR | 2002-0020921 | 3/2002 |

* cited by examiner

*Primary Examiner*—Walter Lindsay, Jr.
(74) *Attorney, Agent, or Firm*—Mayer Brown Rowe & Maw LLP

(57) ABSTRACT

A method for forming a dual damascene interconnection in a semiconductor device. An etch stop film and an intermetal insulating film are formed sequentially on a lower metal film. A via hole is formed to expose a portion of a surface of the etch stop film through the intermetal insulating film. A sacrificial film is formed to fill the via hole. Portions of the intermetal insulating film and the sacrificial film are removed to form a trench. The sacrificial film is removed to expose the portion of the surface of the etch stop film. A plasma etching process is performed at a predetermined temperature using an etching gas to remove the exposed portion of the etch stop film and to prevent or suppress generation of a polymer. A diffusion barrier film is formed within the trench and the via hole such that the diffusion barrier contacts the lower metal film. An upper metal film is formed on the diffusion barrier.

4 Claims, 4 Drawing Sheets

RELATED ART

METHOD FOR FORMING DUAL DAMASCENE INTERCONNECTION IN SEMICONDUCTOR DEVICE

BACKGROUND OF THE INVENTION (a) Field of the Invention

The present invention relates to a method for forming an interconnection in a semiconductor device, and more particularly to a method for forming a dual damascene interconnection in a semiconductor device.

(b) Description of the Related Art

Recently, known dual damascene processes have been used to overcome difficulties arising from dry etching of copper interconnections, which have electrical characteristic superior to aluminum (Al) or tungsten (W) interconnections.

In the known dual damascene process, a via hole and a trench are formed, and the via hole and trench are filled with a copper film.

FIGS. 1 to 3 are sectional views illustrating a method for forming a conventional dual damascene interconnection.

As shown in FIG. 1, first, an intermetal insulating film 120 is formed on an etch stop film 110 on a lower metal film 100, the lower metal film 100 configured to be interconnected. Subsequently, a mask pattern for via hole formation is formed on the intermetal insulating film 120. Thereafter, a via hole 130 is formed using the mask pattern.

Next, the mask pattern is removed, and a mask pattern is used to form a trench 140. When the via hole 130 and trench 140 are formed, a portion of a surface of the etch stop film 110 on the lower metal film 100 is exposed.

As shown in FIG. 2, a dry etching process is used to remove the exposed portion of the etch stop film 110. A $C_xF_y$ gas is used as an etching gas. Polymers 150 are generated, however, on exposed surfaces of the lower metal film 100 and side walls of the intermetal insulating film 120.

As shown in FIG. 3, a diffusion barrier 160 is formed within the via hole 130 and trench 140 such that the diffusion barrier 160 contacts the exposed lower metal film 100. An upper metal film 170 is then formed on the diffusion barrier 160 such that the via hole 130 and the trench 140 are completely filled with the upper metal film 170.

Subsequently, a planarization process is performed to complete a dual damascene interconnection.

However, as discussed above, the conventional method for forming a conventional dual damascene interconnection results in the generation of the polymers 150 while the exposed portion of the etch stop film 110 is removed. The polymers 150 generally remain on the exposed surfaces of the lower metal film 100 and side walls of the intermetal insulating film 120, even after cleaning of the surfaces is attempted. The polymers 150 cause deterioration of contact resistance. In addition, water absorption by the polymers may result in corrosion of the lower metal film.

SUMMARY OF THE INVENTION

To address the above described and other problems, it is an object of the present invention to provide a method for forming a dual damascene interconnection in a semiconductor device, which is capable of preventing or minimizing deterioration of contact resistance. The deterioration of the contact resistance can be prevented or minimized by preventing or suppressing the generation of polymers during removal of the etch stop film.

Accordingly, the present invention can provide a method for forming a dual damascene interconnection in a semiconductor device. An etch stop film and an intermetal insulating film are formed sequentially on a lower metal film. A via hole is formed to expose a portion of a surface of the etch stop film through the intermetal insulating film. A sacrificial film is formed to fill the via hole. Portions of the intermetal insulating film and the sacrificial film are removed to form a trench. The sacrificial film is removed to expose the portion of the surface of the etch stop film. A plasma etching process is performed at a predetermined temperature using an etching gas to remove the exposed portion of the etch stop film and to prevent or suppress generation of a polymer. A diffusion barrier film is formed within the trench and the via hole such that the diffusion barrier contacts the lower metal film. An upper metal film is formed on the diffusion barrier.

Preferably, the etching gas includes an inert gas and one or more of a $CF_4$, $CHF_3$, and $CH_3$ gas. The inert gas preferably is an argon (Ar) gas.

Preferably, the predetermined temperature is from about 0 to about 40° C.

Preferably, the etch stop film includes a nitride film.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE INVENTION

The present invention is described in detail with reference to the accompanying drawings. It is to be understood that the disclosed embodiments may be modified in various forms, and that therefore do not limit the scope of the invention recited in the claims.

FIGS. 4 to 8 are sectional views illustrating a method for forming a dual damascene interconnection according to the present invention.

Figure 1:
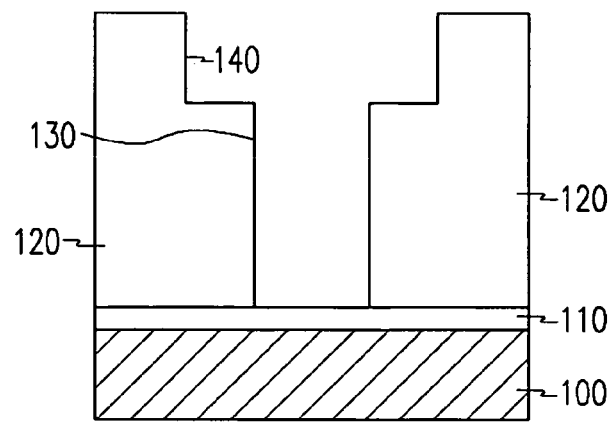
FIGS. 1 to 3 are sectional views illustrating a method for forming a conventional dual damascene interconnection.
Figure 2:
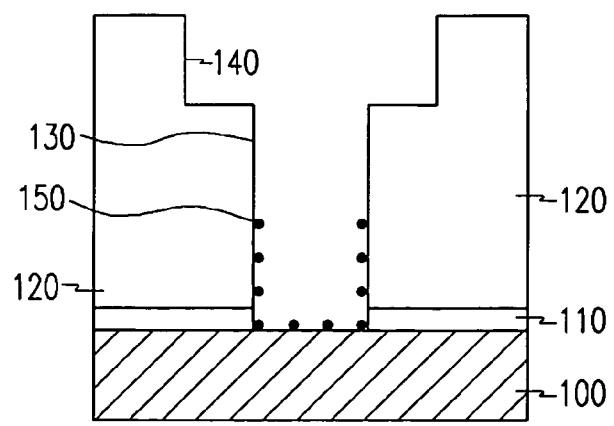
Figure 3:
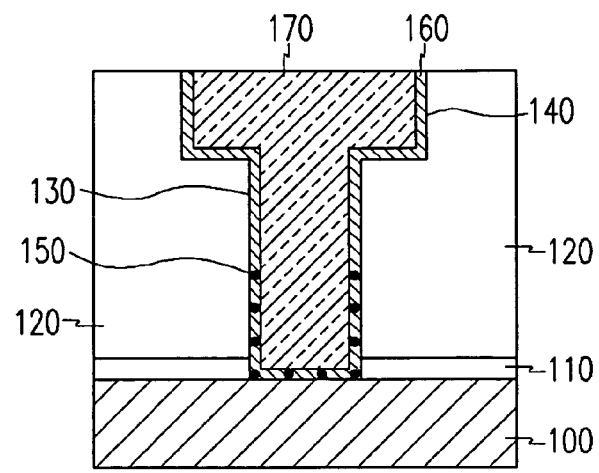
Figure 4:
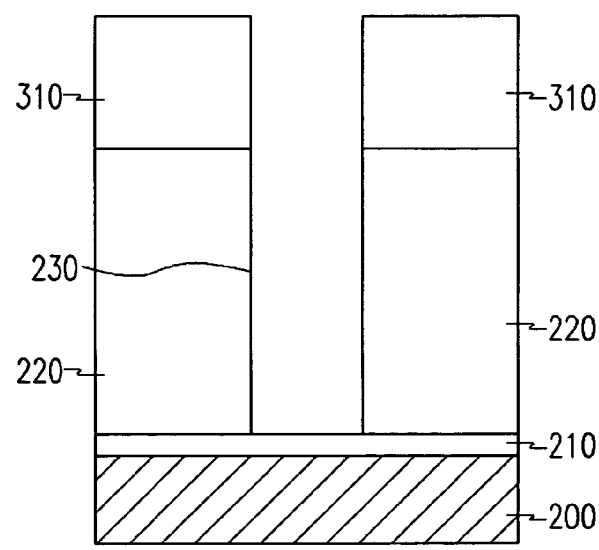
FIGS. 4 to 8 are sectional views illustrating a method for forming a dual damascene interconnection according to the present invention.

Referring to FIG. 4, an etch stop film 210 and an intermetal insulating film 220 are sequentially disposed on a lower metal film 200, the lower metal film 200 configured to be interconnected. The lower metal film 200 can be a copper (Cu) film, and the etch stop film 210 can be a nitride film.

A mask pattern 310 for via hole formation is formed on an intermetal insulating film 220. The mask pattern 310 is formed with a photoresist film pattern and has an opening for exposing a portion of a surface of the intermetal insulating film 220. A via hole 230 for exposing a portion of a surface of the etch stop film 210 is formed by removing the exposed portion of the intermetal insulating film 220. The exposed portion of the insulating film 220 can be removed by performing an etching process using the mask pattern 310 as an etch mask.

Figure 5:
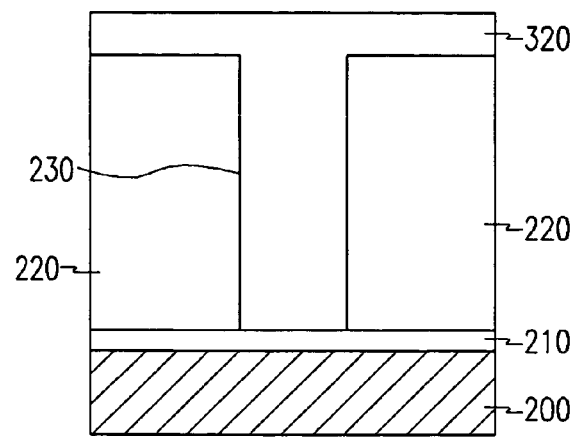

As illustrated in FIG. 5, the mask pattern 310 is removed, and a sacrificial film 320 is formed and fills the via hole 230. The sacrificial film 230 can be a film easily removed in a subsequent process, such as a photoresist film.

Figure 6:
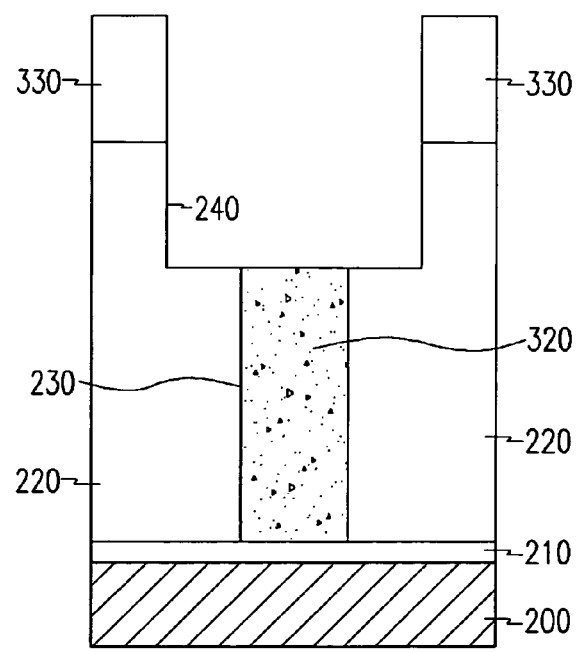

As illustrated in FIG. 6, a top surface of the intermetal insulating film 220 is exposed by performing an etch-back process for the sacrificial film 320. A mask pattern 330 for trench formation is formed with a photoresist film on the intermetal insulating film 220. A trench 240 is formed by removing portions of the intermetal insulating film 220 and the sacrificial film 320. The insulating film 220 and the sacrificial film 320 can be removed by performing an etching process using the mask pattern 330 as an etch mask.

Figure 7:
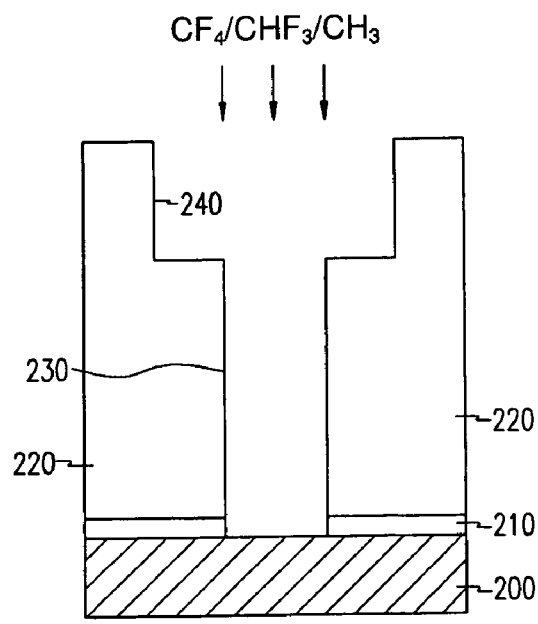

As shown in FIG. 7, the sacrificial film 320 is removed from the via hole 230 to expose the portion of the surface of the etch stop film 210. The sacrificial film 320 can be removed by a known or conventional ashing process. The mask pattern 330 is removed, and can be removed simultaneously with the removal of the sacrificial film 320.

The exposed portion of the etch stop film 210 is removed by performing a plasma etching process. The plasma etching process can occur at a predetermined temperature at which polymers are not generated, or at which polymer generation is suppressed, while using an etching gas to prevent the polymers from being generated, or to suppress polymer generation. The etching gas can include a gas having a relatively small carbon (C) component, such as a $CF_4/CHF_3/CH_3$ gas, and an inert gas, such as an argon (Ar) gas. The relatively small carbon content is understood to refer to a predetermined carbon content capable of preventing or suppressing polymer generation. The chuck for supporting a wafer in the plasma etching process can be maintained at a temperature from about 0 to about 40° C. Within this temperature range, even when polymers are generated, the polymers are vaporized without remaining in the via hole 230.

Figure 8:
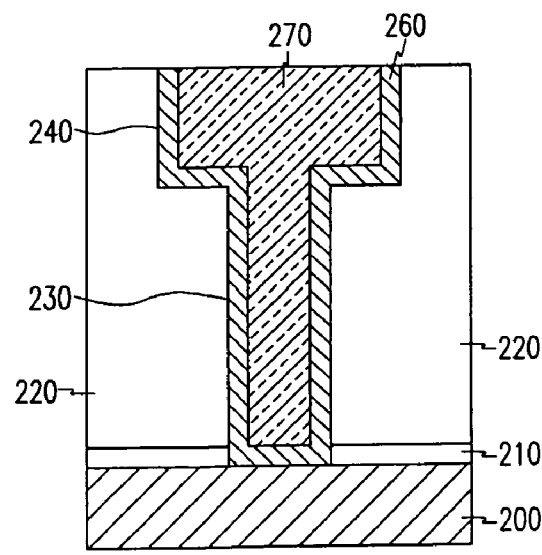

As shown in FIG. 8, a diffusion barrier 260 is formed within the trench 240 and the via hole 230 such that the diffusion barrier 260 contacts the lower metal film 200. An upper metal film 270 is formed on the diffusion barrier 260 such that the via hole 230 and the trench 240 are filled with the upper metal film 270. The upper metal film can be a copper film.

A known or conventional planarization process is performed to expose the top surface of the intermetal insulating film 220. By this process, a dual damascene interconnection in accordance with the present invention can be formed.

As apparent from the above description, with the method for forming a dual damascene interconnection according to the present invention, by performing the etching process to remove the etch stop film (i) at a temperature at which generation of polymers is suppressed, and/or (i) using a gas having a relatively small carbon (C) component, polymers remaining in the via hole can be minimized, and deterioration of contact resistance can be prevented. Accordingly, electrical characteristics of semiconductor devices formed in accordance with the present invention can be improved.

Although preferred embodiments of the present invention have been described in detail, it is to be understood that variations and/or modifications of the basic inventive concepts herein taught which may appear to those skilled in the present art are within the spirit and scope of the present invention, as defined in the appended claims.

This application incorporates by reference in its entirety an application for METHOD FOR FABRICATING THE DUAL DAMASCENE INTERCONNECTION IN SEMICONDUCTOR DEVICE filed in the Korean Industrial Property Office on Dec. 31, 2003, and there duly assigned Serial No. 10-2003-0101807.

What is claimed is:

1. A method for forming a dual damascene interconnection in a semiconductor device, comprising the steps of:
    forming an etch stop film and an intermetal insulating film sequentially on a lower metal film;
    forming a via hole to expose a portion of a surface of the etch stop film through the intermetal insulating film;
    forming a sacrificial film with which the via hole is filled;
    removing portions of the intermetal insulating film and the sacrificial film to form a trench;
    removing the sacrificial film to expose the portion of the surface of the etch stop film;
    performing a plasma etching process at a temperature of 0–40° C. using a $CF_4/CHF_3/CH_3$ gas and an Ar gas to remove the exposed portion of the etch stop film;
    forming a diffusion barrier film within the trench and the via hole such that the diffusion barrier contacts the lower metal film; and
    forming an upper metal film on the diffusion barrier.

2. The method according to claim 1, wherein the etch stop film comprises a nitride film.

3. A method for forming a dual damascene interconnection in a semiconductor device, comprising:
    step for forming an etch stop film and an intermetal insulating film sequentially on a lower metal film;
    step for forming a via hole to expose a portion of a surface of the etch stop film through the intermetal insulating film;
    step for forming a sacrificial film with which the via hole is filled;
    step for removing portions of the intermetal insulating film and the sacrificial film to form a trench;
    step for removing the sacrificial film to expose the portion of the surface of the etch stop film;
    step for performing a plasma etching process at a temperature of 0–40 C. using a $CF_4/CHF_3/CH_3$ gas and an Ar gas to remove the exposed portion of the etch stop film;
    step for forming a diffusion barrier film within the trench and the via hole such that the diffusion barrier contacts the lower metal film; and
    step for forming an upper metal film on the diffusion barrier.

4. The method according to claim 3, wherein the etch stop film comprises a nitride film.

* * * * *